(12) United States Patent
Abe et al.

(10) Patent No.: US 6,700,829 B2
(45) Date of Patent: *Mar. 2, 2004

(54) MEMORY PACKAGE, MEMORY SYSTEM AND HOT-LINE INSERTION/REMOVAL METHOD THEREOF

(75) Inventors: Seiichi Abe, Odawara (JP); Hirotsugu Yamagata, Odawara (JP); Kazunari Kano, Odawara (JP)

(73) Assignee: Hitachi, Ltd., Tokyo (JP)

( * ) Notice: Subject to any disclaimer, the term of this patent is extended or adjusted under 35 U.S.C. 154(b) by 20 days.

This patent is subject to a terminal disclaimer.

(21) Appl. No.: 10/127,753

(22) Filed: Apr. 23, 2002

(65) Prior Publication Data

US 2003/0093605 A1 May 15, 2003

Related U.S. Application Data

(62) Division of application No. 09/460,765, filed on Dec. 14, 1999, now Pat. No. 6,385,114, which is a continuation of application No. 08/860,967, filed on Nov. 18, 1997, now Pat. No. 6,058,039.

(51) Int. Cl.[7] .................................................. G06F 1/26
(52) U.S. Cl. ........................ 365/226; 711/115; 710/103
(58) Field of Search .......................... 365/226; 711/115; 710/103

(56) References Cited

U.S. PATENT DOCUMENTS

| | | | |
|---|---|---|---|
| 3,816,768 A | 6/1974 | Stein | 307/296 |
| 4,631,701 A | 12/1986 | Kappeler et al. | 364/900 |
| 4,962,485 A | 10/1990 | Kato et al. | 365/229 |
| 5,027,328 A | 6/1991 | Nakashima | 365/226 |
| 5,077,675 A | 12/1991 | Tam | 364/480 |
| 5,204,840 A | 4/1993 | Mazur | 365/228 |
| 5,245,582 A | 9/1993 | Kimura | 365/229 |
| 5,319,515 A | 6/1994 | Pryor et al. | 361/93 |
| 5,572,478 A | 11/1996 | Sato | 365/226 |
| 5,590,082 A | 12/1996 | Abe | 365/222 |
| 5,636,347 A | 6/1997 | Muchnick et al. | 395/283 |
| 5,815,426 A | 9/1998 | Jigour et al. | 365/51 |
| 5,831,351 A | 11/1998 | Khosrowpour et al. | 307/139 |
| 5,877,975 A | 3/1999 | Jigour et al. | 365/52 |

FOREIGN PATENT DOCUMENTS

| | | |
|---|---|---|
| JP | 1-175617 | 7/1989 |
| JP | 4-253290 | 9/1992 |

*Primary Examiner*—Zarni Maung
*Assistant Examiner*—Jungwon Chang
(74) *Attorney, Agent, or Firm*—Antonelli, Terry, Stout & Kraus, LLP

(57) ABSTRACT

A memory package for storing data and capable of being added to or replaced while being provided with a battery backup in computer systems which can be mounted with a plurality of said memory packages. A memory package also has a function to reduce power consumption of the battery backup to a minimum, when the memory package with battery backup is inserted into the computer system without the main power being applied. Consequently, even if additional memory packages are inserted which require battery backups, only a weak current need be supplied from the backup power supply so that the battery will not run down after a short time. The memory packages can therefore be added and replaced while still storing data internally and the memory capacity can be changed. Also, a memory system is provided including a power supply supplying power supply lines connected to the memory packages. Diode and/or surge protection arrangements are also provided to facilitate hot line insertion and removal.

4 Claims, 15 Drawing Sheets

MEMORY PACKAGE, MEMORY SYSTEM AND HOT-LINE INSERTION/REMOVAL METHOD THEREOF

CROSS-REFERENCE TO RELATED APPLICATIONS

This is a divisional of application Ser. No. 09/460,765, filed Dec. 14, 1999 now U.S. Pat. No. 6,385,114, which is a Continuation of application Ser. No. 08/860,967, filed Nov. 18, 1997 now U.S. Pat. No. 6,058,039, the entire discloses of which are hereby incorporated by reference.

TECHNICAL FIELD

This invention relates to hot-line insertion-removal technology for memory systems in computers and more particularly relates to a technology for the addition and replacement of memory packages in computer systems being backed up by a battery by utilizing storage elements for retaining data (including programs) by means of the battery backup without loss of the data stored In the memory packages.

BACKGROUND ART

A technique is disclosed In Japanese laid-open patent application Sho 63-153899, now Japanese Patent 1,795,501 issued on Oct. 28, 1993, for insertion and removal of packages with the main power still applied (commercially available power).

A technique Is also disclosed in Japanese laid-open patent application Sho 61-163423, now Japanese Patent 2,022,376 issued on Feb. 26, 1996 for battery backup of device packages.

Further, technology is also known for power supply methods for insertion and removal as in Japanese laid-open patent application Hei 5-46281, for which no examination was requested, in a method which separately supplies power to package power supplies by hot-line insertion and removal; and to package power feed systems not having hot-line insertion and removal.

These prior technologies do not take into account hot-line insertion and removal of packages white power is being supplied by a battery backup and also do not adequately consider fluctuations in the power supply voltage during Insertion and removal of the package within the power feed system.

In this prior technology, consideration was not given to hot-line (in other words with power still applied) insertion and removal of packages mounted with storage elements for battery backup In the storage devices of computer systems backed up by a battery.

Some possible reasons for non-use of hot-line insertion and removal are that maintenance is generally performed on the computer hardware and software only after turning off the power to shut down the computer system.

Another main reason Is that both the computer system and the storage device were thought to be items capable of being handled only by experts and which required an operator having a specialist's knowledge.

However, peripheral equipment which form basic components of a computer system became more reliable so that longer operations without shutdowns came to be expected. Stronger demands were made for replacement of programs, and collection and maintenance of data in the computer systems not subject to shutdowns. The performance of small-sized computer systems (in other words personal computers) Improved, making it necessary for the ordinary individual to be capable of running a computer. Reasons such as listed above caused a demand for technology to allow the replacement or addition of memory packages In computer systems driven or backed up by batteries without losing the data stored in these memory packages.

Further, the DRAM is rarely used in memory packages having a battery cell backup. The reason being that DRAM devices required a recharge for the memory function and consume more power compared to the SRAM device.

Due to the above circumstances, the Inventors therefore developed a storage device to meet the above needs. In their investigations, the Inventors discovered that, in memory packages with DRAM devices having a self-refresh mode (function to retain only data with an extremely small electrical current compared with normal current consumption), the hot-line insertion-removal failed in computer systems having a battery backup; where insertion/removal of the prior art functioned by means of the connector pin length, The cause of the failure was lack of a control mechanism to switch over to the DRAM self-refresh function.

A current surge that occurred when a memory package was Inserted, was found to cause adverse effects on other than the target memory package.

More specifically, when a package was inserted during battery backup, the control circuit for the package being Inserted did not function because there was no main power. Accordingly, a current several times that of the current required in a normal battery backup state was drawn for consumption by the DRAM memory mounted in the package Inserted with the power applied (hot line) so that the energy In the battery used as the backup was quickly expanded and the service life of the backup battery was extremely short. In worst cases, data was lost in memory packages that had a battery backup up to that time.

So, even if the DRAM memory was not utilized, the operation was unsatisfactory since the control circuit for the inserted package did not function, because there was no main power.

Further, If the package was Inserted with the main power applied, the resulting current surge caused a large voltage fluctuation In the power supply, adversely affecting other packages and causing malfunctions In the logic circuit. This kind of technical problem could not be resolved simply by isolating the power feed systems in the supply line having the battery backup.

In the prior art technology for hot-line insertion and removal, when supplying one large capacity current package and one small capacity current package from the same (power) feed line, a large power fluctuation will occur when the large current capacity package is removed from the line on which the small current capacity package Is Installed, causing malfunctions or damage to occur.

SUMMARY OF THE INVENTION

This invention therefore has the object of providing a means for allowing hot-line Insertion and removal of packages and supplying an extremely small electrical current from the backup power source (battery) for the package that was inserted.

This Invention has the further object of providing power feed line technology that will not damage or cause malfunctions In a package with a small current capacity even if a package with a large current capacity is Inserted or removed.

Accordingly, this invention is provided with:

A) A power line required for the battery backup in the memory package, and a switch to connect the power supply line for battery backup in a memory package wherein:

1) the switch is maintained in the off state when the package is Inserted with the main power supply off,
2) the switch turns on at a first time constant when the package is Inserted with the power supply on, and the switch turns off at a second constant when the package is removed,
3) the switch maintains an on status when the main power is turned from on to off while the package is still inserted.

B) The power feed system has an Inductor Installed inside the chassis of the computer system connected in parallel with a diode installed inside the package.

The power feed line for the large current capacity package and the feed line for the small current capacity package are separated in a power feed system where the current capacity of the package that is mounted is larger than the current capacity of the package that was removed. The power feed lines are further structured to feed power from one power supply unit by means of a diode in the power feed system line.

A) As a result, hot line insertion and removal of the memory package is possible while being backed up by the battery since current consumption is limited in the memory package. Another beneficial result is that current surges into and out of the memory package can be diminished.

When Inserting a package during battery backup while the main power is off, the electrical current drawn from the package battery decreases so that the electrical charge stored in the battery is not used up.

B) Current surges, and spark discharges that occur then removing other packages from the circuit board can be prevented. By making the current surge smaller when the package is inserted, power supply fluctuations are reduced which serves to prevent adverse effects such as malfunctions in packages other than the package being inserted or removed.

The power feed lines for packages with large current capacity are separated from lines of packages with small current capacity so that even if the large current capacity package is inserted or removed there are no adverse effects on the small current capacity package. Moreover the load of large current capacity packages on the same power feed system line is small so damage or package malfunctions can be prevented. The diode Installed in the feed line prevents noise from entering from among the power feed lines so that the feed lines can all be supplied from one power supply.

DETAILED DESCRIPTION OF PREFERRED EMBODIMENTS

Figure 1:
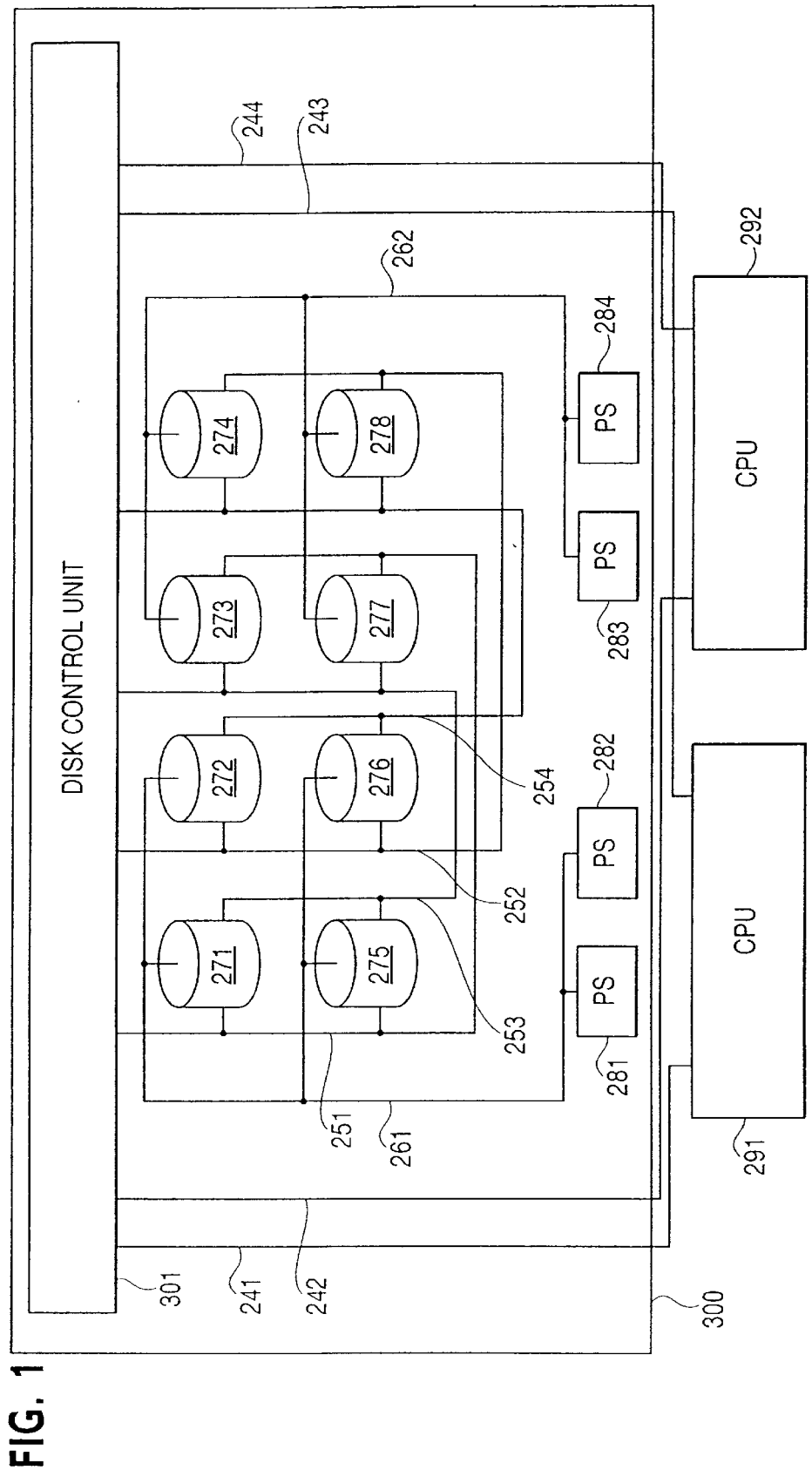
FIG. 1 is a block diagram showing the overall structure of the disk array unit of an embodiment of this invention.

Hereafter an embodiment of the invention will be explained while referring to the drawings.

Disk array unit and other computer systems

The explanation utilizing FIG. 1 through FIG. 16 involves mainly the disk array unit of a first embodiment of this invention. However, this invention is not limited to the examples described and illustrated, but is applicable to the workstations, desktop computers or notebook type computers shown in FIG. 17 as well. For instance, a plurality of slots can be provided in these units for attachment to a connector 1172 in FIG. 17. The memory package 24 can then be inserted or removed as needed with the power applied (hot-line).

Further, in order to increase the memory capacity of the memory package 25 (FIG. 18, FIG. 19) a memory storage element 2501 may be installed in the memory card conforming to PCMCIA standards.

A connector 1173 of the memory package should have a specific sequence for making connector pin contact during hot-line insertion and removal of the memory package according to the pin length of a connector 117 In FIG. 4, as will be described later, for instance under limitations from PCMCIA memory card standards or SIMM standards. So making settings for pin contacts for the computer system would be necessary.

As each of the dotted lines In FIG. 4, FIG. 10, FIG. 11 and FIG. 14 show, the data and programs exchanged with the computer system up to the removal of an individual memory package from the system can be stored or retained Internally in the memory package by means of a battery backup.

Figure 16:
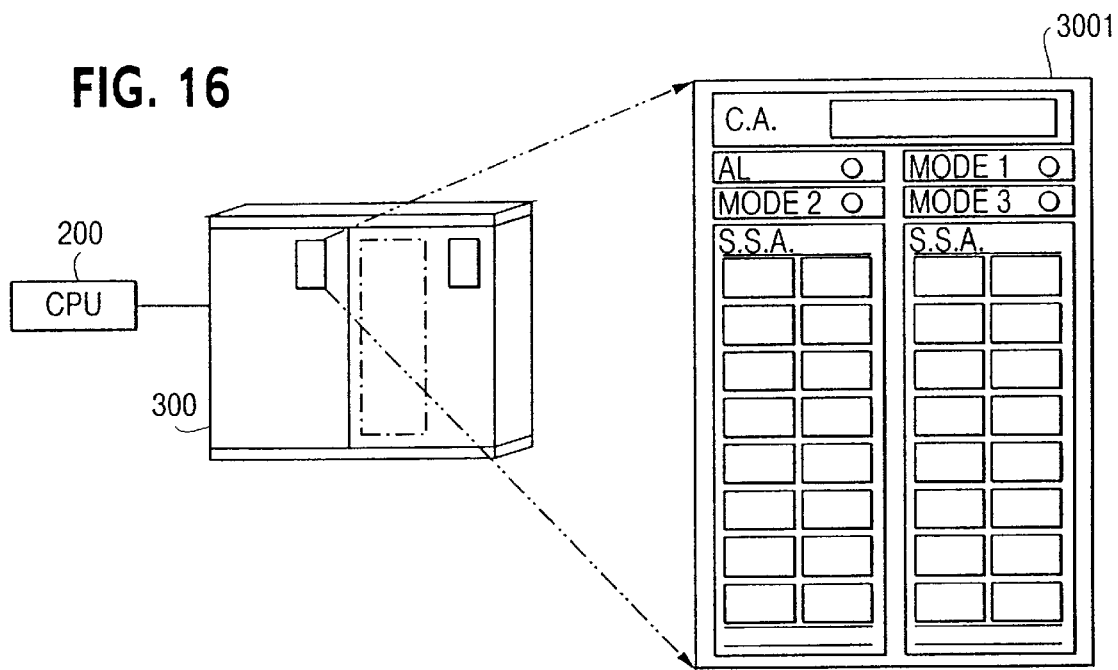
FIG. 16 is a diagram showing an external view of the disk array unit of FIG. 1.

FIG. 16 shows the external view the disk array unit 300 (RAID) of the first embodiment of this Invention.

A disk array unit 300 is connected to a CPU 200, which is a central processor unit, and is controlled on the basis of instructions from the CPU 200. Text data from the disk array unit and data Identifiers from drive data information for the disk array unit 300 are displayed on the operating panel 3001, which is provided with various operating buttons.

Figure 2:
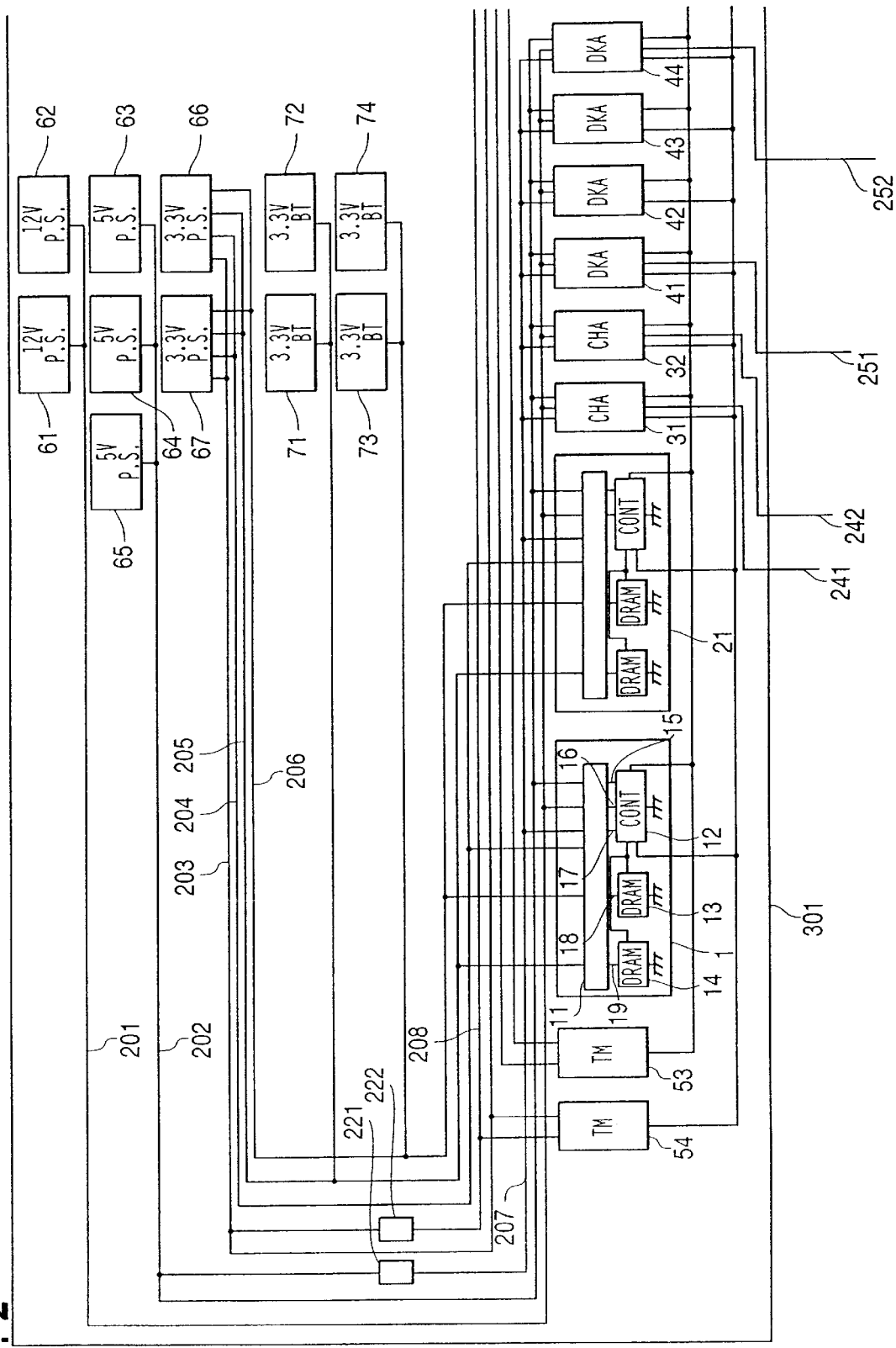
FIG. 2 Is a schematic circuit diagram showing the left half of the disk control unit 301 in FIG. 1.
Figure 3:
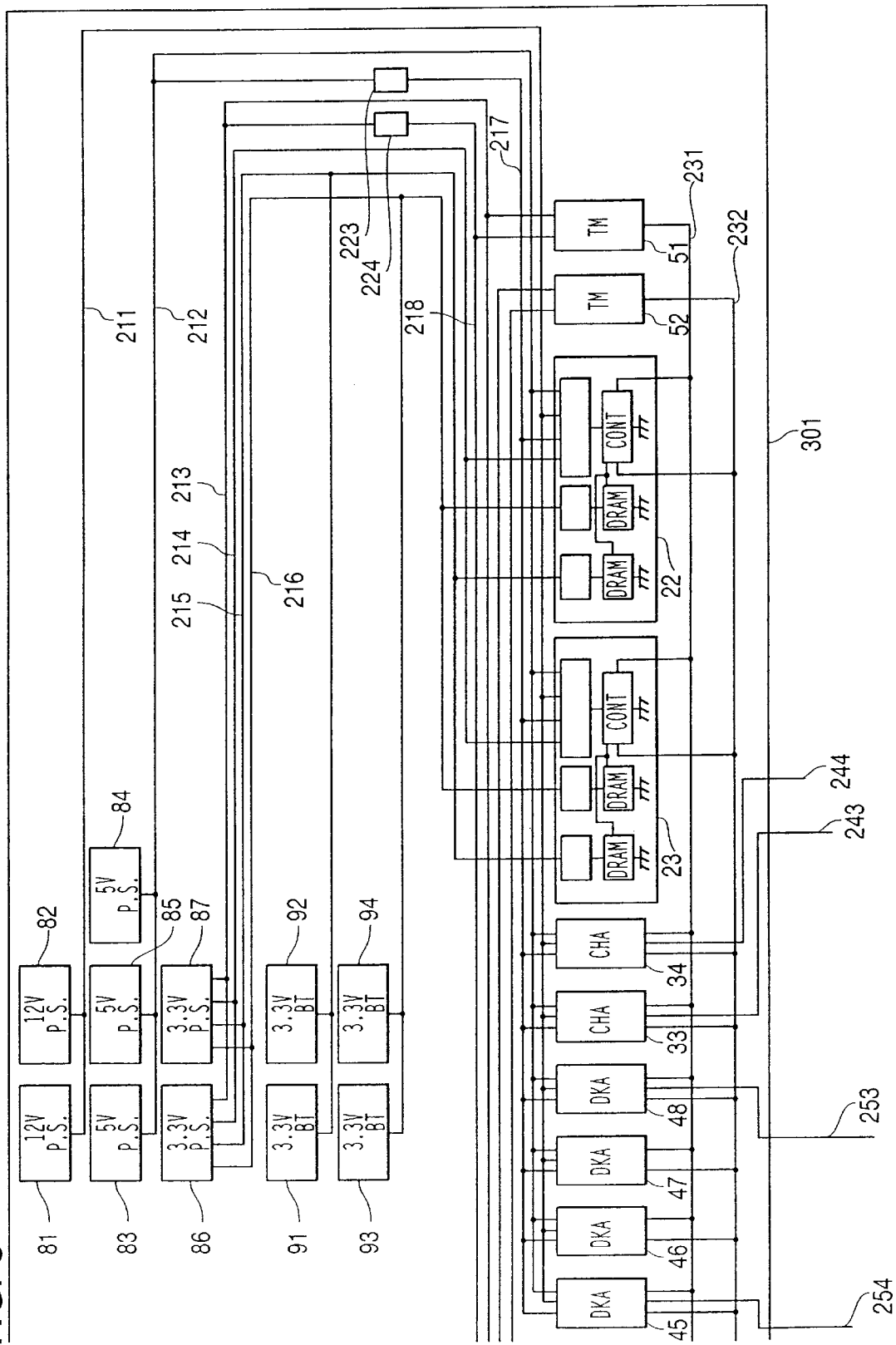
FIG. 3 is a schematic circuit diagram showing the right half of the disk control unit 301 In FIG. 1.

The structure of the disk array unit 300 is shown in FIG. 1. FIG. 2 and FIG. 3 show the internal structure of the disk control unit 301. The memory packages 1 and 21 are shown in the center portion of the lower half of FIG. 2, while the memory packages 22 and 23 are shown in the center portion of the lower half of FIG. 3 and their respective connections are shown from FIG. 4 onwards.

The disk array unit 300 as shown in FIG. 1 is comprised of the disk control unit 301; a plurality of disk drives 271, 272, 273, 274, 275, 276, 277 and 278; and a plurality of power supply units 281, 282, 283, and 284.

The disk control unit 301 in FIG. 2 and FIG. 3 is comprised of;

a plurality of power supply units 61, 62, 63, 64, 65, 66, 67, 71, 72, 73, 74, 81 (FIG. 3) 82, 83, 84, 85, 86, 87, 91, 92, 93 and 94; a plurality of disk adapter boards, 41 (DKA: FIG. 2), 42, 43, 44, 45 (FIG. 3) 46, 47, and 48;

a channel adapter board 31 (CHA: FIG. 2) 32, 33 (FIG. 3) and 34; a plurality of memory packages (or cache memory boards) 1 (FIG. 2) 21, 22 (FIG. 3) and 23;

a plurality of terminator boards 51, (TM: FIG. 3) 52, 53 (FIG. 2), and 54;

a plurality of power feed lines 201 (FIG. 2) 202, 203, 204. 205, 206, 207, 208. 211 (FIG. 3) 212, 213, 214, 215, 216, 217, and 218; and a plurality of buses 231 (FIG. 3) and 232. The power feed lines here have a surge current suppressor devices 221, 222 (FIG. 2), 223 and 224 (FIG. 3) to prevent current surge during hot-line insertion More specifically, utilizing the inductors as passive circuit elements such as Inductors and resistors will prove economical. Active circuit elements such as custom ICs having a surge current protection function may be utilized.

Figure 4:
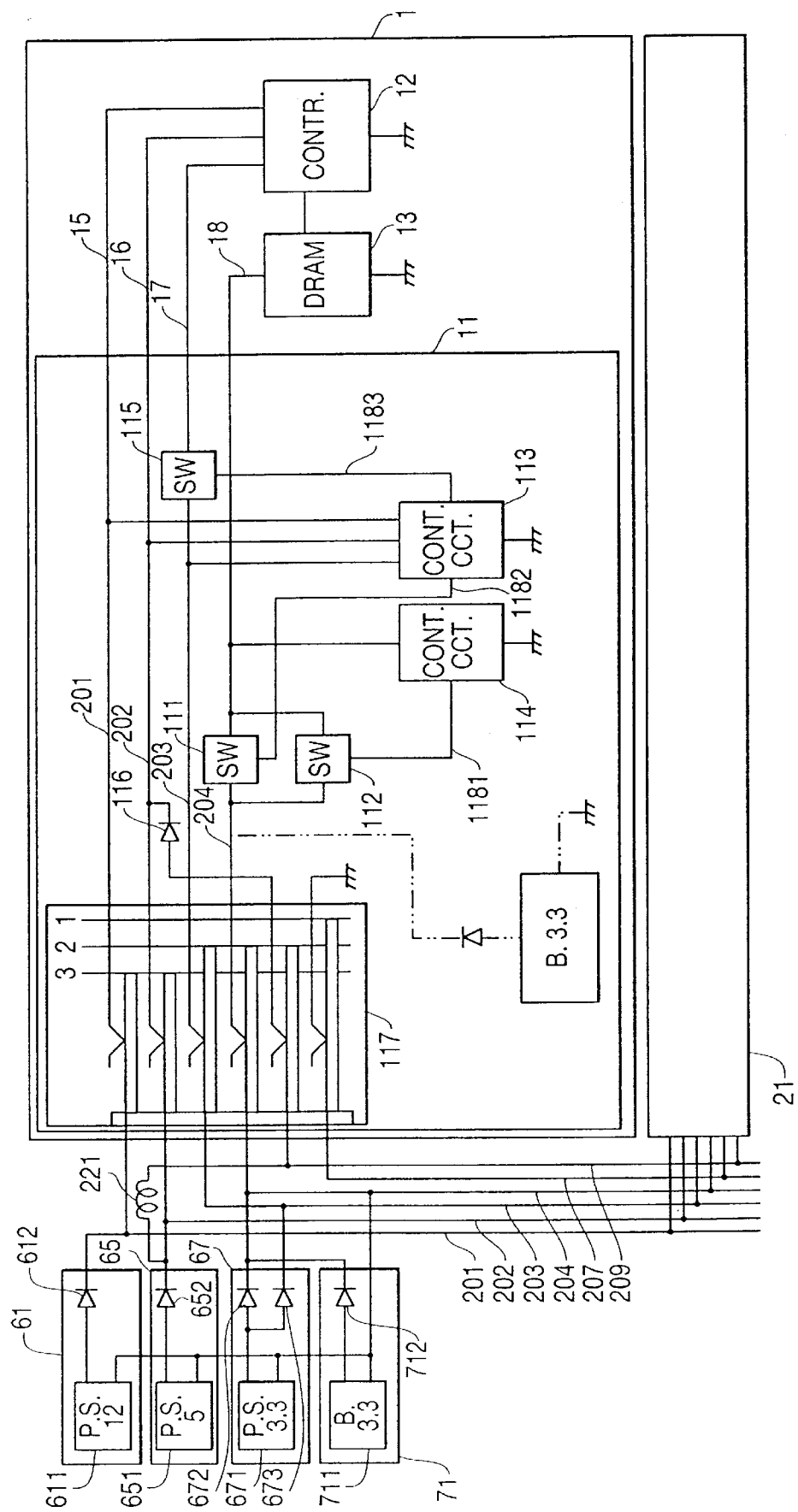
FIG. 4 is a schematic circuit diagram illustrating the memory package 1 and the computer system in the first embodiment of this invention.
Figure 15:
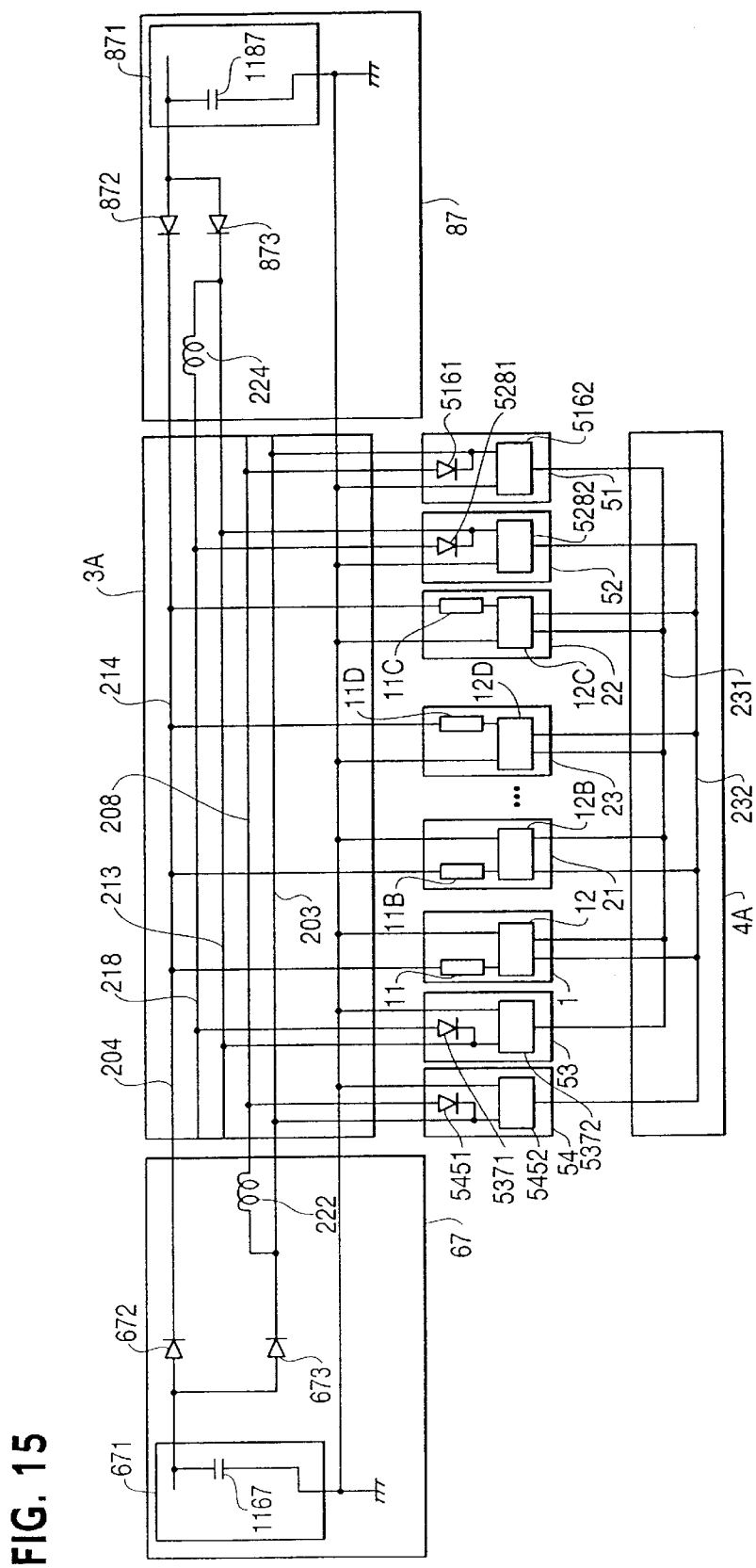
FIG. 15 is a schematic circuit diagram showing connections with a plurality of feed lines and a plurality of packages of the disk array unit in the first embodiment of this invention.

The inductors utilized in the embodiment of this invention, for instance the inductor inside the system chassis and the diode inside the memory package are connected serially with the feed lines as shown in FIG. 4 and FIG. 15.

This arrangement allows the inductors to limit current surges when the memory package is inserted and also reduces fluctuations in the power supply voltage. The inductors are Installed inside the system chassis and thus are not subject to space limitations. This arrangement is also cheaper than installing comparatively high priced diodes in each package for use as inductors.

The diodes can also prevent voltage fluctuations from entering other packages when the memory packages are being removed. Two power supply line paths can be directly connected to one power supply by means of Inductors.

The inductors are Installed inside the system chassis so the external dimensions of the inductor components can be designed as needed. Also, the diodes are connected in series with the inductors Inside the memory package so that the inductor current surge limiting function can be utilized and a small capacity diode can therefore he utilized.

The small capacity diode has small external dimensions so the outer dimensions of the memory package can be designed as needed.

The disk adapter board (DKA) controls data transfer with the disk drives by means of an SCSI interface 251 (FIG. 2), 252, 253 (FIG. 3) and 254.

The channel adapter board (CHA) regulates data transfer with a plurality of host CPUs 291, and 292 by means of channels 241, (FIG. 2) 242, 243 (FIG. 3) and 244.

The memory package (cache memory beard) is comprised of a cache memory 13 (FIG. 2) for temporarily storing data between the host CPU 291, 292 and the disk drive units;

a common memory 14 to store disk adapter, channel adapter and cache memory control information;

a control circuit 12 to control the above-mentioned two types of memories; and also has a power supply control circuit 11 for maintaining an extremely small current to the battery power supply or to the power supply backed up by the battery when the memory package is inserted without the main power being applied.

The disk array unit shown In FIG. 1 has two power feed lines. The power feed systems in FIG. 2 and FIG. 3 will be described later.

This arrangement therefore allows the disk adapter board, channel adapter board, memory package, terminator board and buses to continue operating even if one of the power supply units is damaged so that the disk array unit 300 does not stop operation.

Each power line also has respective power supply units, disk adapter boards, channel adapter boards and memory packages which can be hot-line inserted or removed.

The cache memory 13 and the common memory 14 are separate within the memory package. This arrangement prevents loss of the crucial contents of the common memory 14 when the cache memory 13 has incurred damage and when the battery backup time for the common memory 14 has been longer.

When the main power supplies 61, 62, 63, 64, 65, 66 and 67 in the disk control unit 301 of the disk array unit 300 are off and the memory package 21 is storing data by means of the batteries 71, 72, 73, and 74; inserting the memory package 1 again, triggers the power supply circuit 11 In the memory package 1 so that excessive power will not be supplied to the memory package from the battery. Exhaustion of the battery backup is therefore prevented and hot-line insertion is allowed. Further, there is no loss of data from the memory package 21 which was previously mounted in the disk array unit 300.

The memory package 1 and its connections are shown In FIG. 4.

The plurality of memory packages 1 and 21 have battery backup and circuit elements for providing hot-line insertion and removal.

As peripheral circuit elements, the memory package 1 has a battery power supply unit 71, a 3.3 volt main power supply unit 67, a 5 volt main power supply unit 65 and a 12 volt main power supply unit 61.

Power is supplied via a backplane 12 volt main power supply line 201, a backplane 5 volt main power supply line 202, a backplane 3.3 volt main power supply line 203, a backplane 3.3 volt power supply line 204 backed up by battery, a backplane grand power supply line 207, and a backplane 5 volt power supply line 209 for hot-line insertion and removal; and an Inductor 21 is provided to prevent a current surge when the memory package 1 or 21 is inserted.

The term "backplane" refers to a support meter for printed circuit boards fastened In the system chassis and having assorted connectors. The backplane connectors are electrically connected to the circuit boards and fastened mechanically in place.

The power supply units 61, 65, 67 and 71 are comprised of power supply circuits 611, 651, 671, 711 and diodes 612, 652, 672, 673 and 712. Each of the power supply units is connected to the backplane power supply lines 201, 202, 204, and 203 by means of these diodes. Consequently, when the main power is off, electrical current can flow because the diodes are not reverse-biased so that switching to the battery power supply or reserve power supply is possible when the main power is damaged or inoperable.

The plurality of memory packages 1 or 21 available for battery backup each have a power supply control circuit 11, memory 13 and control circuit 12.

The power supply control circuit 11 in the memory package 1 has a first switch 111 for connecting the power supply line 18 of the memory 13 (DRAM device) mounted In the memory package 1 for battery backup, with the power supply line 204 backed up by a battery;

a control circuit 113 to control the on state of the first switch 111 when voltage is applied to the power supply lines 201, 202, and 203;

a second switch 112 connecting the power supply line 204 backed up by a battery, with the power supply line 18 of the memory 13 (DRAM device) mounted in the memory package 1 for battery backup;

a control circuit 114 to control the on state of the second switch 112 when voltage Is applied to the power supply line 18 of the memory 13 (DRAM device) for battery backup;

a third switch 115 to connect the 3.3 volt power supply line 203 with the 3.3 volt power supply line 17 of the memory package 1;

a diode 116 to connect the 5 volt bias power supply line 209 with the 5 volt power supply line 202; and a connector 117.

Figure 5:
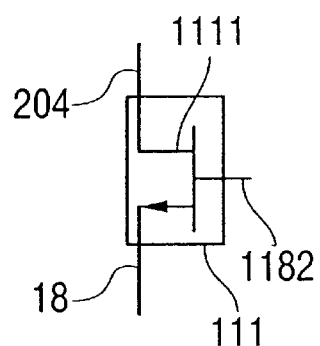
FIG. 5 is a schematic diagram illustrating the circuit layout of the switch 111 of the memory package 1 in FIG. 4.
Figure 6:
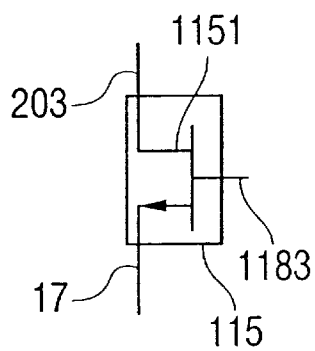
FIG. 6 is a schematic diagram illustrating the circuit layout of the switch 115 of the memory package 1 in FIG. 4.

An example of the first switch 111 is shown in FIG. 5.

Figure 20:
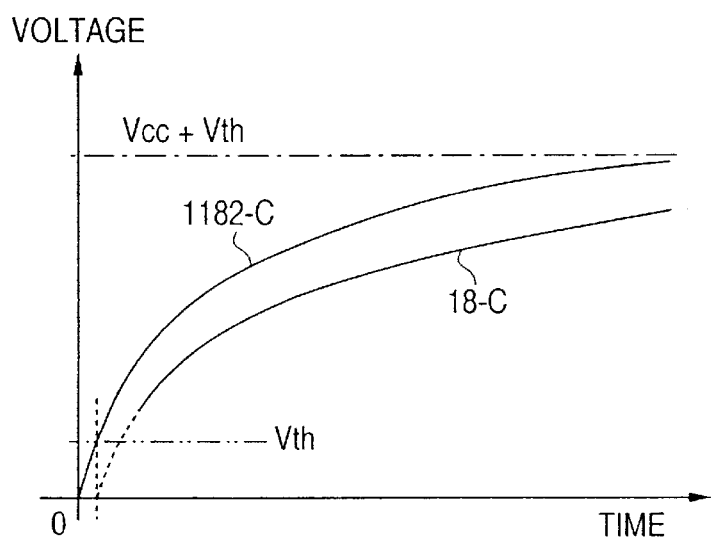
FIG. 20 is a graph illustrating the rise characteristics of the transistor switch shown in FIG. 5 and FIG. 6.

When an NMOS transistor 1111 is utilized, the voltage V1 of power supply line 18 is controlled to be a value less the NMOS transistor threshold voltage Vth from the voltage Vg of control signal 1182. The rise time of the voltage V1 of power supply line 18 can therefore be regulated by the control signal 1182 (FIG. 20). This rise is determined In accordance with the curve for the CR time constant in FIG. 9.

When the memory package is inserted, the power supply line 204 Is first connected and then the main power supply line 201 is connected and the rise of the control signal 1182 commences. When an FET switch is used as shown in FIG. 5, current leakage is slight and a high off impedance is obtained. The circuit structure is also simple and reliability is high. A moderate voltage rise can be obtained with one transistor.

An example of the third switch 115 Is shown in FIG. 5.

Just as In FIG. 5, if an NMOS transistor 1151 is utilized as the switch 115, regulation can be achieved in the same way as with the switch 111. Accordingly, the voltage V1' rise time of power line 17 can be regulated by means of the control signal 1183.

Figure 9:
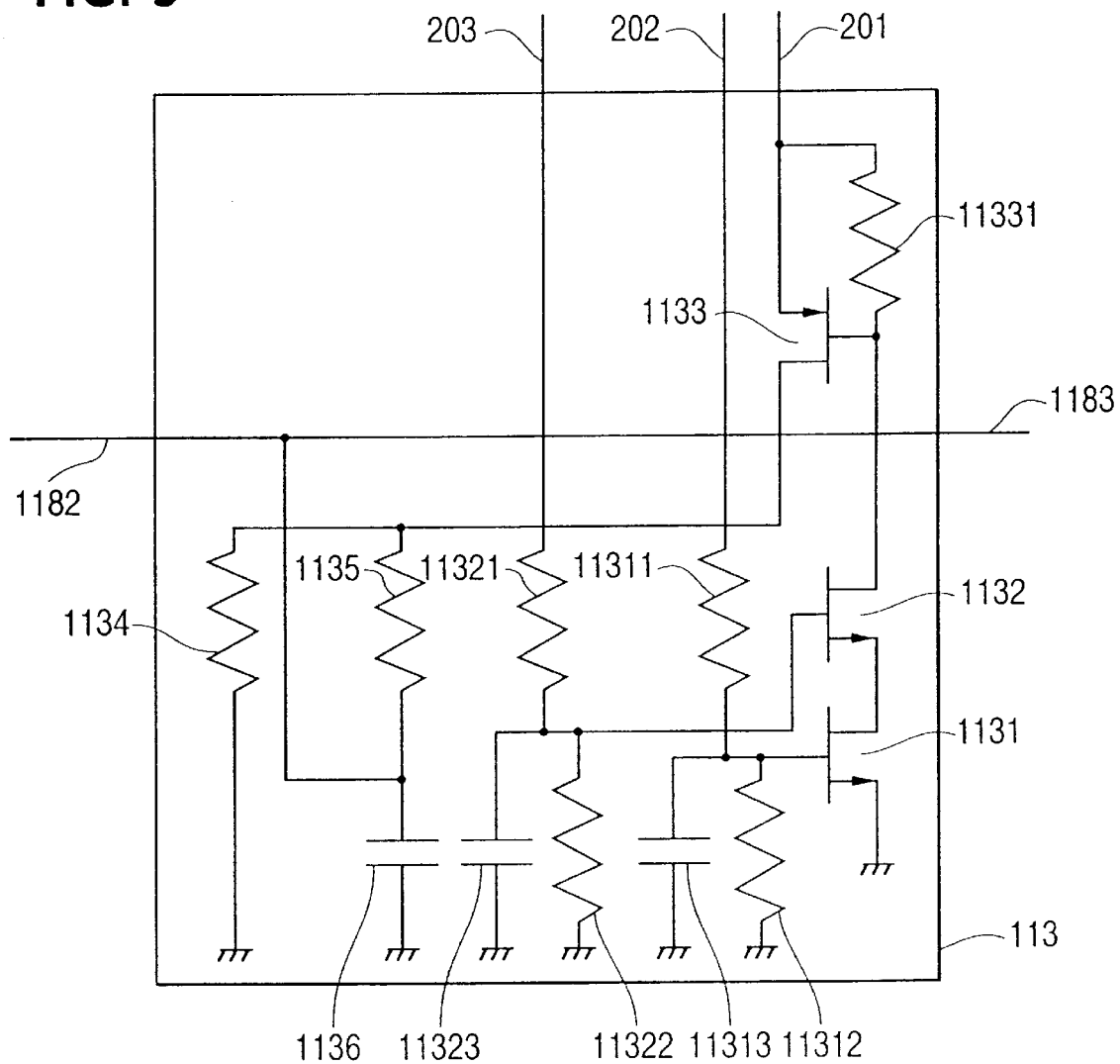
FIG. 9 is a schematic diagram illustrating the circuit layout of the control circuit 113 of the memory package 1 in FIG. 4.

An example of the control circuit 113 (FIG. 4) Is shown in FIG. 9.

When power is applied to the main power lines 201, 202, 203, the control circuit 113 for turning the first switch 111 on, is comprised of the NMOS transistors 1131 and 1132, the PMOS transistors 1133, resistors 11311, 11312, 11321, 11322, 11331, 1134 and 1135 and, the capacitors 11313, 11323 and 1136.

When a voltage is not applied to any of the power supply lines 201, 202, or 203, the power line voltage will fall to zero volts. The output signal (control signal) 1182 and 1183 will therefore fall to zero volts due to the resistor 1134.

When a voltage is applied to all the power supply lines 201, 202, and 203, the NMOS transistors 1131, 1132 will turn on and the PMOS transistor 1133 will turn on. Turning on these transistors applies a voltage to the serially connected resistor 1135 and the capacitor 1136 and the rise of control signals 1182. 1183 connects at the constant of the component pair, i.e. resistor 1135 and capacitor 1136.

The resistors 11311, 11312 and resistors 11321, 11322 are designed to have a value greater than the threshold voltage Vth of the NMOS transistors 1131, 1132 at the voltage values of main power supplies 202 and 203.

The time constants for capacitors 11313, 11323 with the resistance value of the parallel resistors of 11311, 11312 and the parallel resistors 11321 and 11322 are designed to be greater than the rise time of the main power supplies, 202 and 203.

This arrangement allows for variations In the threshold voltages Vth of the NMOS transistors 1131, 1132 and the values of the resistors 11311, 11312 and 11321 to be compensated by setting the time constant of the capacitors 11313 and 11323 to match differences with the rise time of the main power supplies 202 and 203. Consequently, a high priced power supply monitor IC need not be used and an economical circuit is obtained.

Figure 7:
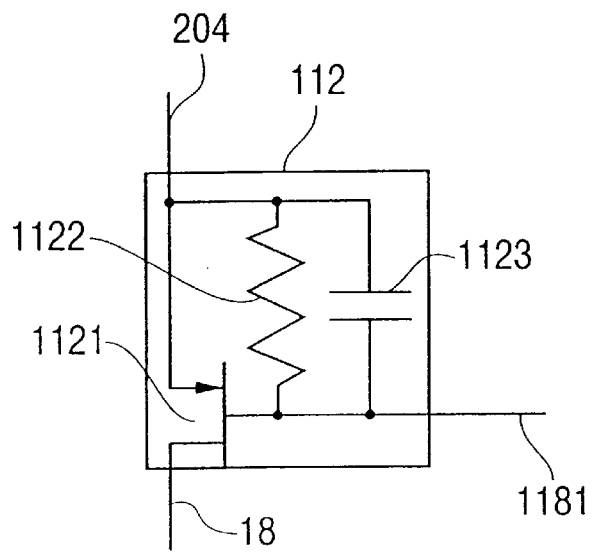
FIG. 7 is a schematic diagram illustrating the circuit layout of the switch 112 of the memory package 1 in FIG. 4.

An example of the second switch 112 (FIG. 4) is shown in FIG. 7.

The second switch 112 is comprised of a PMOS transistor 1121, a capacitor 1123 and a resistor 1122.

When a voltage from power supply line 18 Is applied to the second switch 112 while the control signal 1181 is open, the gate voltage at the capacitor 1123 and the resistor 1122 is approximately the same as the voltage at the power supply tine 18 so that the PMOS transistor 1121 turns off.

The second switch 112 turns on when the control signal 1181 is at a low level (approximately 0 volts). No gate bias power supply Is required so that the switch can operate just with the battery backup power supply. The resistance of the resistor 1122 must be large so that current drawn during battery backup will be small. Therefore, the capacitor 1123 must be sufficiently large compared to the gate capacitance of the PMOS transistor 1121, and along with selecting component values that will yield a fast gate voltage rise time, circuit design must allow for sufficient capacitance to protect against adverse effects from unwanted noise.

Figure 8:
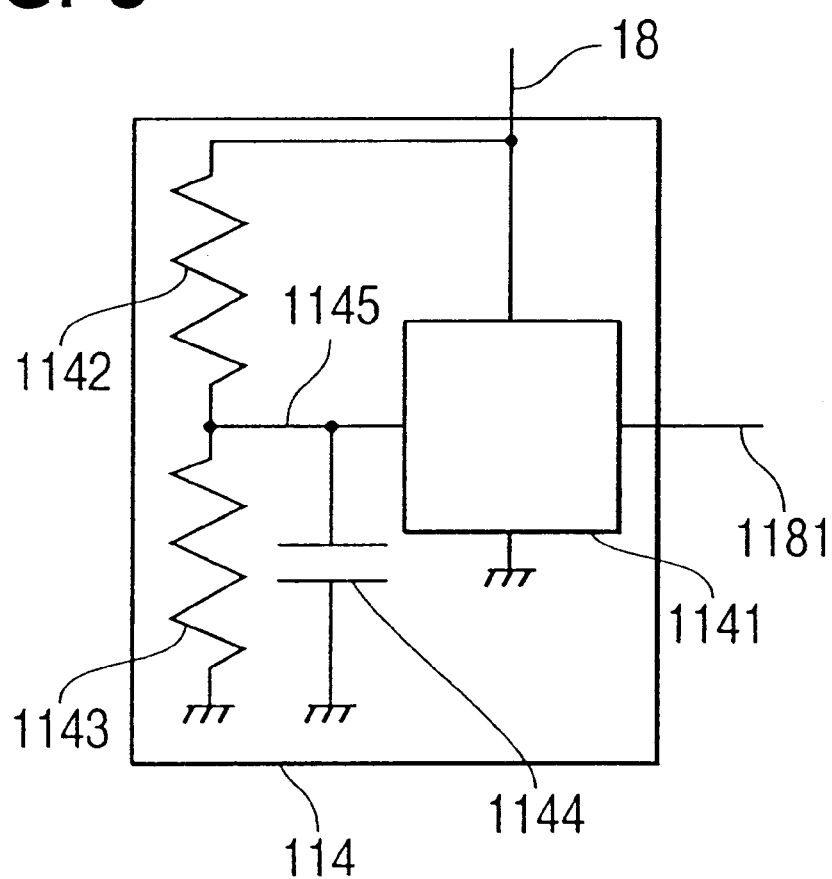
FIG. 8 is a schematic diagram illustrating the circuit layout of the control circuit 114 of the memory package 1 in FIG. 4.

An example of the control circuit 114 (FIG. 4) is shown in FIG. 8.

The control circuit 114 regulates the control signal 1181 so that the second switch 112 turns on when power is applied to the power supply line 18 of the memory 13 for battery backup.

The control circuit 114 as shown in FIG. 8, comprises a voltage monitor circuit 1141, the resistors 1142, 1143 and the capacitor 1144.

The voltage monitor circuit 1141 opens the output signal (control signal) 1181 when the Input signal 1145 is lower than a preset voltage. When input signal 1145 is higher than the preset voltage, the output signal 1181 Is set to a low level (approximately 0 volts).

The time constant formed by the resistors 1142, 1143 and the capacitor 1141 Is set to be larger than the rise time of the power supply line 18 voltage V1.

With this arrangement, the control circuit 1141 triggers when the power supply line 18 has completely risen and sets the output signal 1181 to a low level. As a result, the second switch 112 sets to on.

Further, the resistors 1141 and 1143 have a large resistance value in order to reduce the power supply current during battery backup. Therefore, capacitor 1144 must have sufficient capacitance to protect the control circuit 114 from the adverse effects of external electromagnetic noise.

When the memory package 1 is inserted into the system, the grand power supply line 207 is first inserted in the connector 117 (FIG. 4) and then the power supply lines 202, 201 are Inserted third. The pin length of the connector 117 is set to electrically connect the power supply lines in the above sequence. During removal of the package the same sequence occurs in reverse order.

The operation when the memory package 1 is inserted during battery backup of the memory package 21, an shown in FIG. 4, will be described.

The power supplies 61, 65, and 67 are off during battery backup of the computer system. The power supply lines 201, 202, 203, 207 and 209 are approximately zero (0) volts at this time. Consequenuy, the switch control signals 1182 and 1183 of the control signal circuit 113 are set to approximately zero (0) volts.

The first switch 111 and the third switch 115 are off due to the above settings.

The power supply line 18 is set to approximately 0 volts because no power is supplied and the output signal 1 181 of the control circuit 114 turns off. The second switch 112 (FIG. 4) turns off due to the above and the power consumed in the package 1 from the 3.3 volt power supply line 204 is extremely small. This extremely small power consumption in memory 13 is possible because only electrical current for consumption by the control circuits 12,113 and 114 flows In the memory package 1.

Consequently, the power from the 3.3 volt power supply line 204 is not consumed in the memory 13 and power is conserved so that the backup battery does not wear out and the problem of a short battery backup time for the package 21 is thus resolved.

In other words, during hot-line insertion of the memory package 1 in the conventional art, a considerable amount of power received through power supply line 204 is consumed by the memory 13 of the memory package 1. This high power consumption quickly drains the power from the battery backup cell. However, the present invention eliminates the problem of the backup battery being drained of power before completion of the hot-line Insertion process.

This low current consumption mode is also maintained during hot-line removal of the memory package 1, so that there is also no current consumption problem during removal.

Hot-line insertion and removal of memory package 1 from the system will be explained for the condition where the power supplies 61, 65, and 67 are on, or in other words when there is sufficient electrical power.

During insertion, the connector 117 makes contact to perform the 1, 2, 3 sequence connections of FIG. 4.

Power Is applied from the main power supplies 61 65, and 87 when the memory package 1 has been installed The control circuit 113 (FIG. 9) is delayed at this time compared to the voltage rise of the main power supplies 201, 202, 203 and the switch control signals 1182 and 1183 rise at the time constant determined by the resistor 1135 and the capacitor 1136.

The first switch 111 and the third switch 115 (FIG. 4) respond to the rise of the voltage V1 of power supply line 204 and voltage V1 of the power supply line 203 at the rise time of the control signals 1182 and 1183. The surge current can therefore be suppressed to a small value and the power supply connected to the control circuit 12 and the memory 13. As a result, power fluctuations that might cause malfunctioning of the package 21 are prevented from occurring In the system.

The removal of the memory package 1 under conditions in which power Is applied from the main power supplies 61, 65 and 67 will be explained next.

In order to isolate the power supply line 201 for package removal In the first step of the removal process, the pin length of the connector 117 is set so the output signal 1182 (or 1183) of the control circuit 113 (FIG. 9) will fall during the period between the tine constant of the resistor 1135 and capacitor 1136, to the tine constant of serially connected resistors 1134, 1135 and capacitor 1136.

The first switch 111 (FIG. 5) and the third switch 115 (FIG. 6) then turn off power supply lines 18 and 17 by the voltage fall due to the above time constant.

Since the power supply voltage drops from the above time constant, the memory 13 for battery backup is set to a backup mode, in other words a time margin occurs to allow setting of a power saving mode. Consequently, the power that is flowing from power supply line 204 (backed up by battery) to the memory package can be reduced.

In this state, the power supply lines 203, 204, and 209 are next removed in the second step of the removal process so that no power fluctuations occur that might cause a malfunction In the package 21.

The retention of the memory package data when switching to battery backup after the main power is removed, regardless of insertion or removal of the memory package, will he described next.

In tins case, the voltage of the output signals 1182 and 1183 of the control circuit 113 fall so that the first switch 111 and the third switch 115 turn off according to the time constant that was set.

However, the voltage V1 of the power supply line 204 will not fall by battery power supply 71, because the second switch 112 has turned on. The control circuit 114 will keep the switch 112 at on, until the voltage at the battery power supply line 204 drops, This arrangement switches the memory package 1 to battery backup status.

In the layout shown of FIG. 4, the user can therefore freely perform hot-line insertion or removal of the battery backed up memory package regardless of the status of the computer system.

There are redundant backplanes inside the chassis and the power supply capacity has the sane voltage ratings as the battery so that additions or removals can be performed as required.

Figure 14:
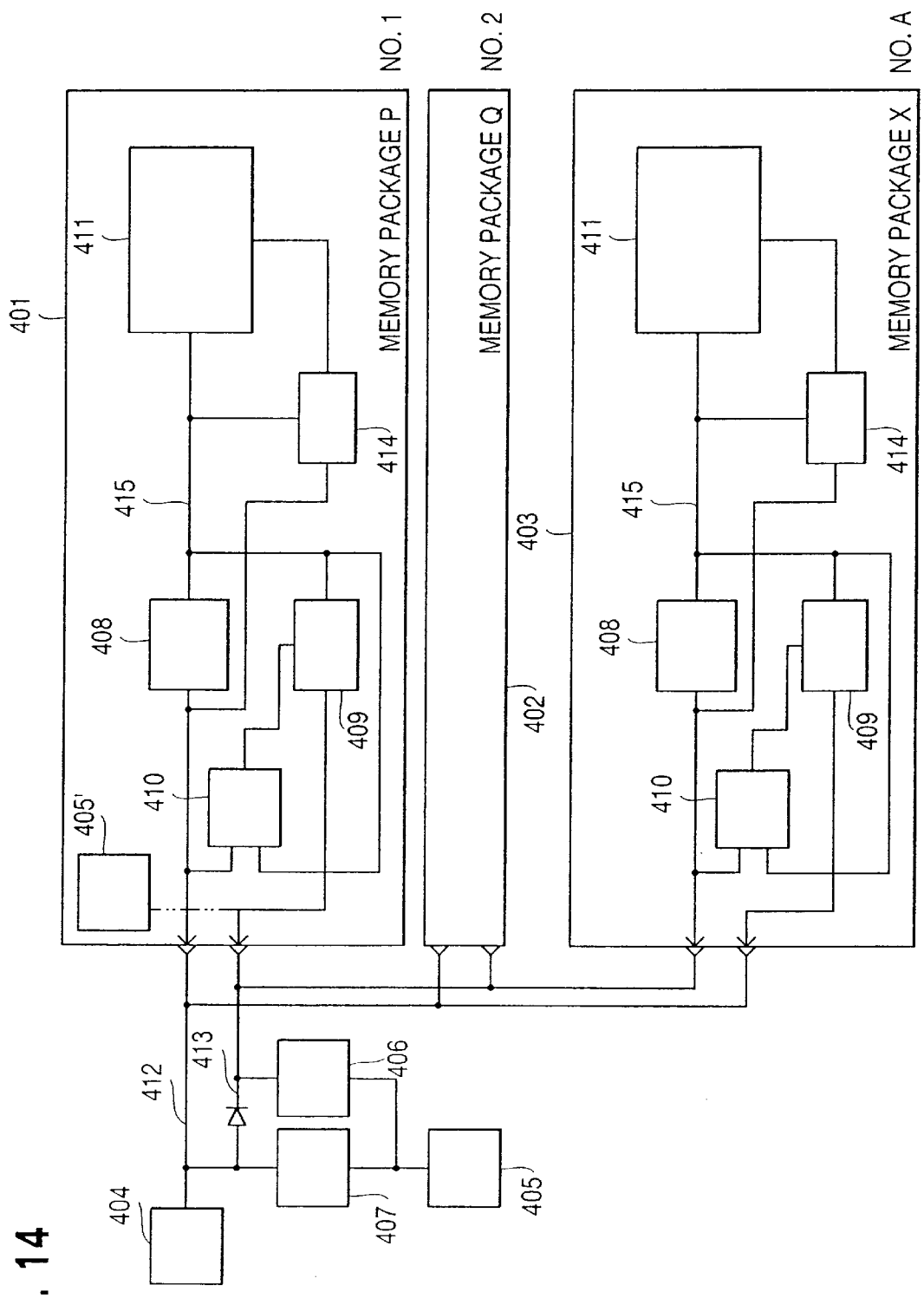
FIG. 14 is a block diagram illustrating the memory package 401 and the connections with the computer system in the fourth embodiment of this invention.
Figure 17:
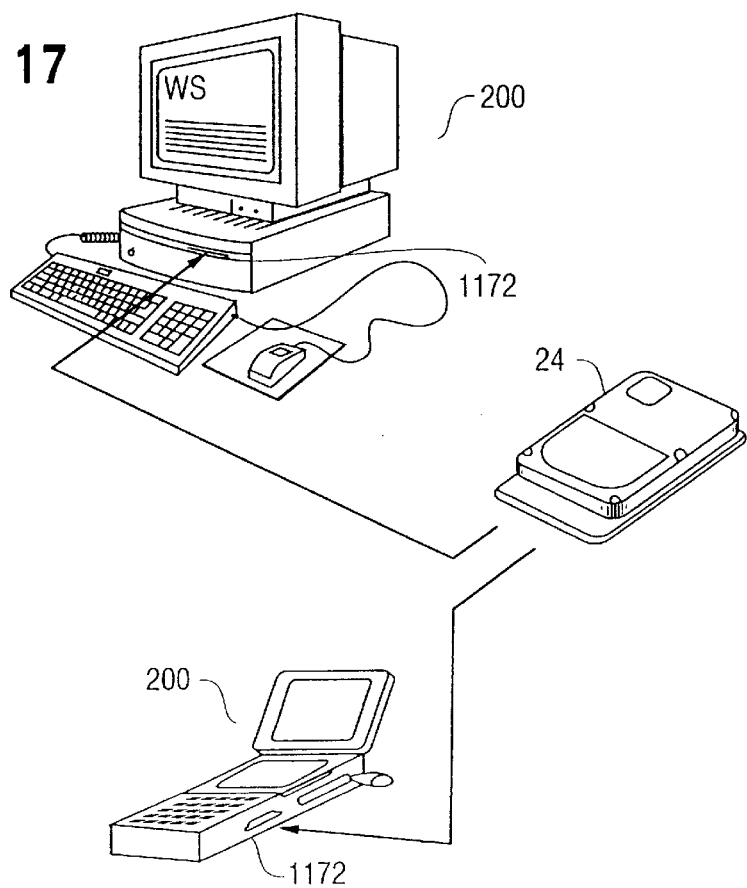
FIG. 17 is a perspective view showing the relation of work station, personal computer or notebook type computer of the second working example of this invention, with the memory package in the embodiment of this invention.
Figure 18:
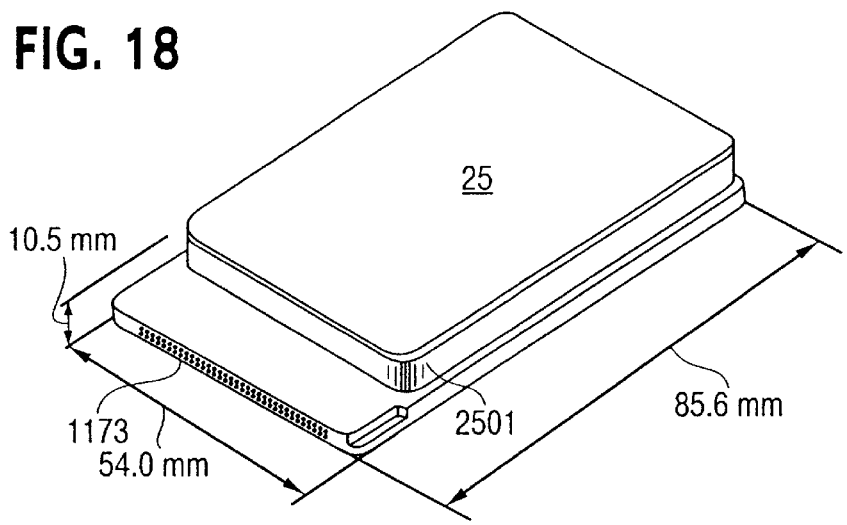
FIG. 18 is a perspective view seen from above of the memory package of an embodiment of this invention.
Figure 19:
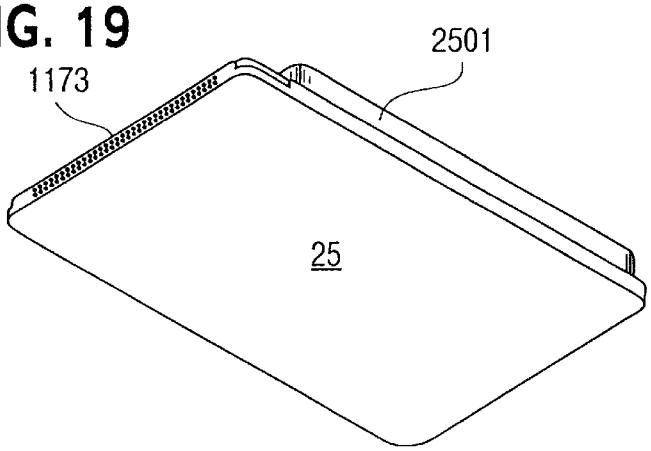
FIG. 19 is a perspective view seen from below of the memory package of FIG. 18.

Further, a backup battery may be incorporated into the memory package 1 of FIG. 4. Luring Installation, the positive terminal of the battery is connected to the power supply line 204 through a diode (diode should be installed to conduct current from the positive terminal of the battery to line 204), and the negative terminal of the battery connected to ground. This memory package containing an internal backup battery is shown in FIGS. 17, 18 and 19 and can for instance conform to PCMCIA memory card or SIMM standards and be compatible with work stations, desktop computers or personal computers and other computer systems. The separate embodiment shown in FIG. 14 illustrates another potential application.

Second Embodiment

Figure 10:
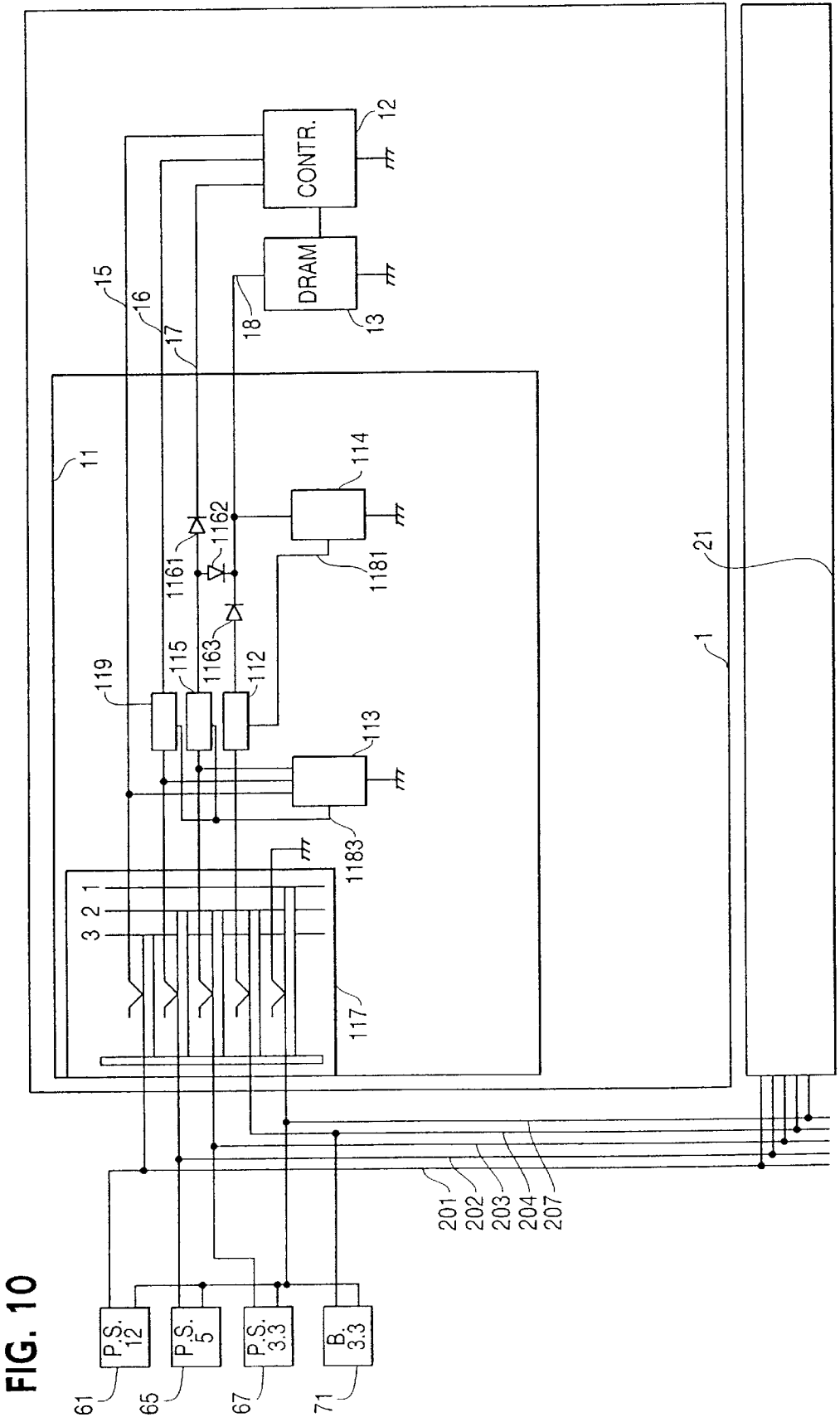
FIG. 10 is a schematic circuit diagram illustrating the memory package 1 and the connections with the computer system in the second embodiment of this invention.

The second embodiment of the memory package and connecting circuits are shown in the layout of FIG. 10. Unless specific mention is made, the circuit elements with the same numbers as in FIG. 4, also perform the same functions in this embodiment.

In this layout, the diodes 1161, 1162, and 1163 are provided inside the memory package 1 in order to supply power from both the main power supply 67 and the battery power supply 71 to the power supply 18 for battery backed up memory 13.

The second switch 112, the control circuit 113 and the control circuit 114 function just the sane as the circuit in FIG. 4. The switch 119 has the same structure as the first switch 111 in FIG. 4 and functions in the sane way. Switch 115 combines the function of the first switch 1111 of FIG. 4.

In this arrangement, just as in FIG. 4, when the memory package 1 has teen inserted during backup by the battery 71 while the main power supplies 67, 65 and 61 are off, the power consumption by the memory package 1 that was inserted will be extremely low. The 5 volt power supply 65 will also have extremely slight voltage fluctuations just as in FIG. 1, even during hot line insertion or removal.

Third Embodiment

Figure 11:
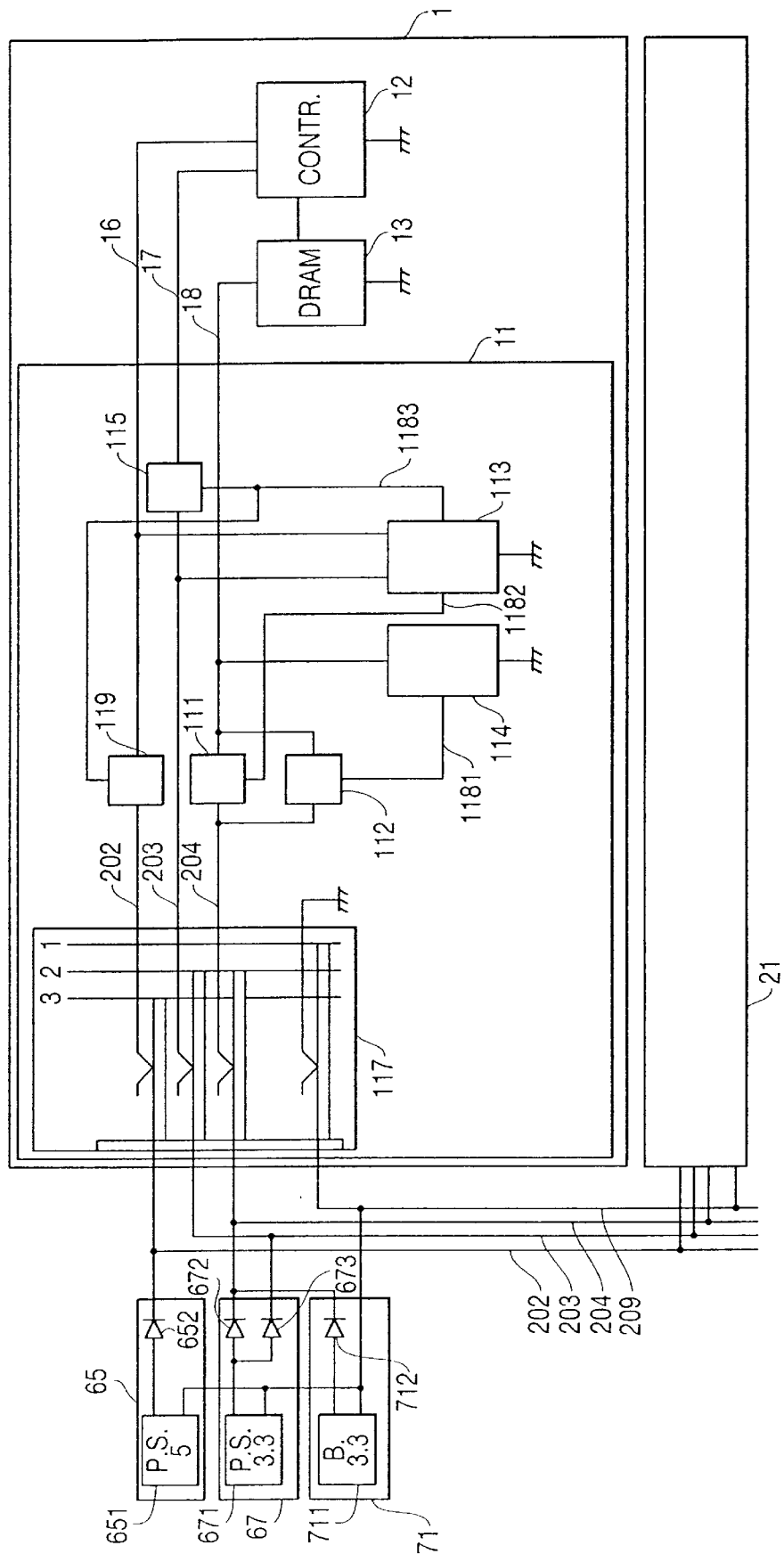
FIG. 11 is a schematic circuit diagram illustrating the memory package 1 and the connections with the computer system In the third embodiment of this Invention.
Figure 12:
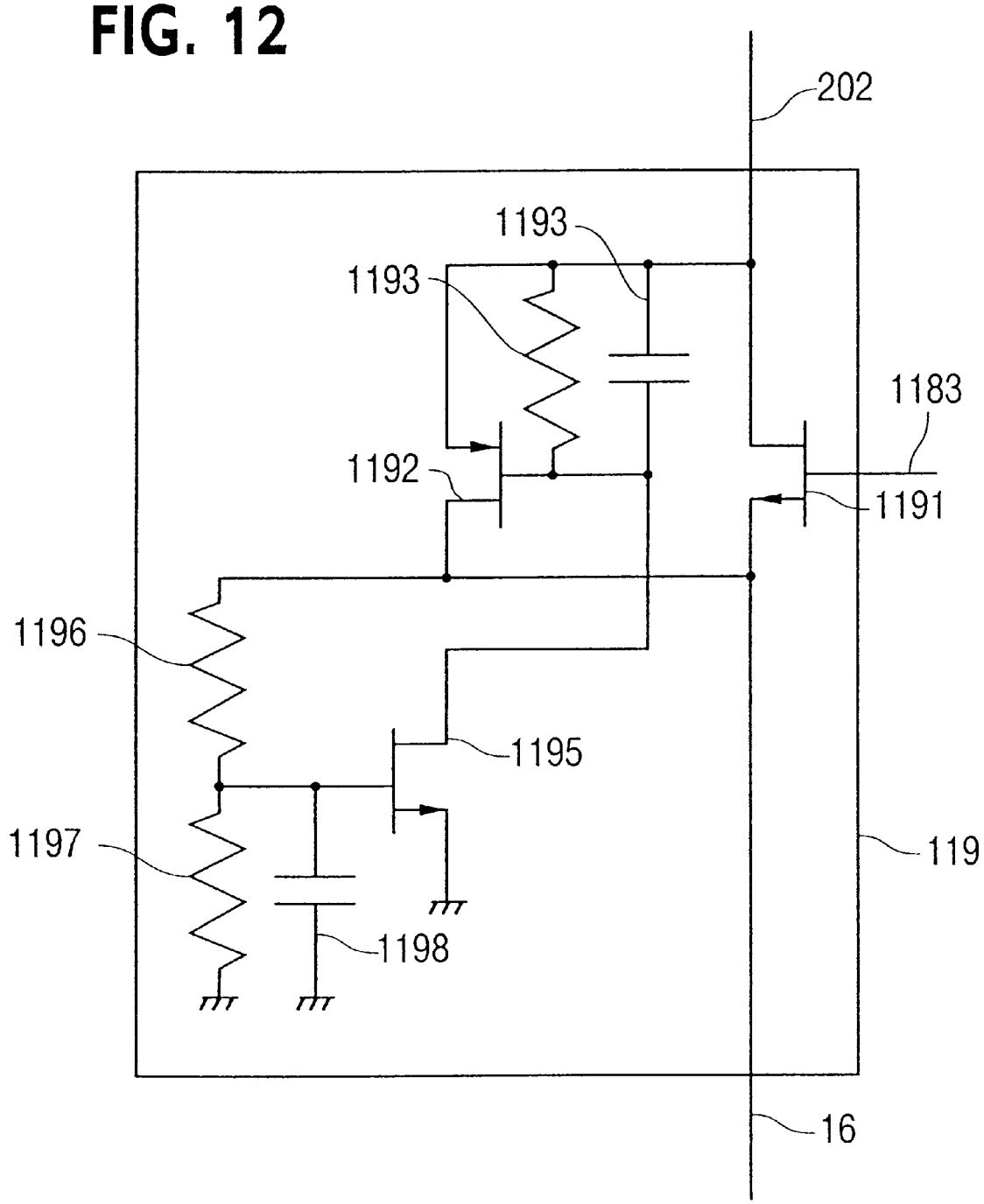
FIG. 12 is a schematic diagram illustrating the circuit layout of the switch 119 of the memory package 1 in FIG. 11.
Figure 13:
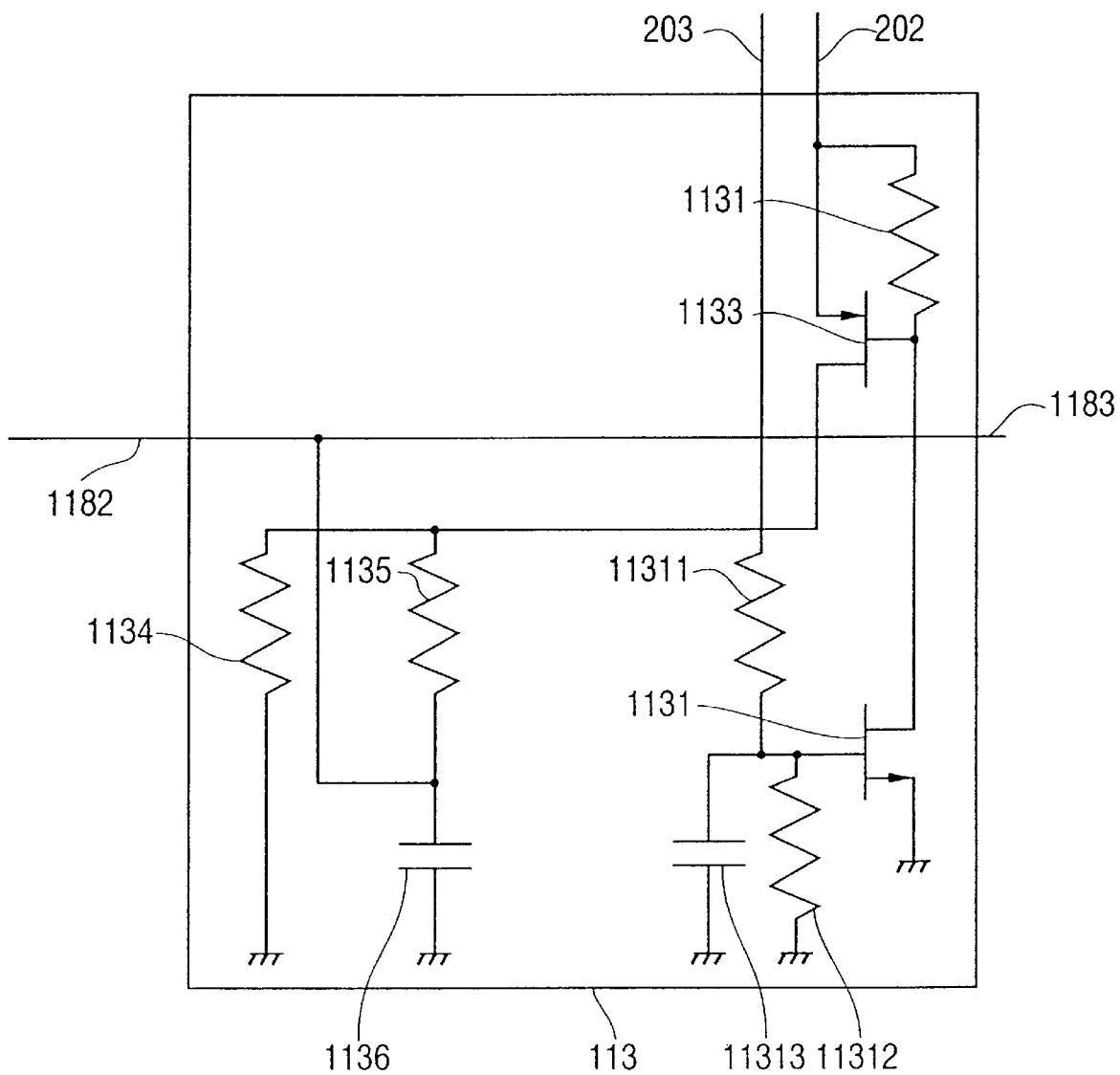
FIG. 13 is a schematic diagram Illustrating the circuit layout of the control circuit 119 of the memory package 1 in FIG. 11.

A third embodiment of the memory package and its connecting circuits are shown in the layout of FIG. 11. Unless specific mention is made, the circuit elements with the same numbers as in FIG. 4, also perform the same functions in this embodiment.

The circuit layout of this embodiment has no 12 volt main power supply. A voltage drop of the NMOS transistor cannot therefore be ignored since the switching bias voltage is low. The switch 119 (FIG. 12) of the 5 volt power supply line 202 is therefore regulated by the control signal 1183 (1182) of the control circuit 113 (FIG. 13) so that the circuit structures of FIG. 4 and FIG. 10 have equivalent functions.

Also, the transistor switches 111, 112, 115, and 119 that turn on and off according to the time constant formed by the capacitor and resistor, can be replaced with a relay device having mechanical contacts. Using a mechanical switch makes it possible to use the simple power supply control circuit 11 when there is no 12 volt main power supply unit. However, limiting the current surge occurring during hot-line transmission according to the time constant formed by the resistor and capacitor can of course no longer be accomplished.

Fourth Embodiment (Other Computer Systems)

A fourth embodiment of this invention is shown in FIG. 14.

The circuit of the computer system of the fourth embodiment as shown In FIG. 14 comprises;
 a plurality of memory packages 401, 402, and 403,
 a main power supply 404, a battery 405, a discharge circuit 406 and a charging circuit 407,
 a main power supply line 412 supplying a plurality of memory packages, and a battery power supply line 413.

The power supply system for the memory package 401 is comprised of the reverse current suppressor circuit 408, a semiconductor switch 409, a semiconductor switch control circuit 410, a volatile semiconductor memory 411, and a memory control circuit 414 to switch the operating mode of the volatile semiconductor memory 411 in response to the status of the main power supply line 412.

When the disk array unit power has been turned on, power is supplied to the memory packages 401, 402, and 403 from the main power supply 404 by means of the main power supply line 412. Power is then supplied to the volatile semiconductor memory 411 by way of the reverse current suppressor circuit 408.

This arrangement permits data to be stored correctly inside the volatile semiconductor memory 411 and allows a response as a memory storage mechanism.

The battery 405 can also be kept charged as needed by means of the charging circuit 407 when the main power supply 404 is turned on.

The semiconductor control circuit 410 maintains the semiconductor switch 409 in an on state when the voltage of the main power supply line 412 or the memory power supply line 415 is within a specified value.

A backup battery can be incorporated into the memory package 401. In such a case, a battery 405 can for instance be connected to the battery power supply line 413 inside the memory package 401.

The memory package 401 containing an internal backup battery is shown in FIGS. 17, 18 and 19 and can for instance conform to PCMCIA memory card or SIMM standards and be compatible with work stations, desktop computers or personal computers and other computer systems.

The circuit operation next will be described while referring to FIG. 14.

The process in which the computer system main power supply turns off and battery backup commences will be described next.

The memory control circuit 414 detects that the main power supply 404 is off due to a voltage drop on the main power supply line 412 and switches the volatile semiconductor memory 411 to the self-refresh mode.

The self-refresh mode referred to here Is a function of the volatile semiconductor memory 411 to store data with extremely low electrical power consumption compared to current consumption during normal operation.

Once switch over Is Instructed, the volatile semiconductor memory 411 switches to the self-refresh mode approximately 100 microseconds later and the electrical current flow in the memory power supply line 415 becomes extremely small so that the backup battery Is capable of being used for an extended period.

No momentary shutdown of the memory power supply line 415 will occur because the current consumption by the volatile semiconductor memory 411 is now extremely small. The on state of the semiconductor power switch 409 can therefore be maintained and electrical current can now be continually supplied from the battery power supply line 413 to the memory power supply line 415.

When the main power supply 404 once again turns on in the memory packages 401 and 402, the memory control circuit 414 detects the specified voltage from the main power supply line 412 and instructs the volatile semiconductor memory 411 to switch from self-refresh mode to normal mode. The volatile semiconductor memory 411 receives this instruction and functions as a memory storage device to allow access to the data that it retains unchanged.

Next, the operation will be described for the condition when a memory package 403 is inserted in mounting position No. A, while the memory packages 401 and 402 of the volatile semiconductor memory 411 are being backed up by a battery.

The voltage on the memory power supply line 415 for memory package 403 and on the main power supply line 412 is below the specified value at this time.

The semiconductor control circuit 410 maintains the semiconductor switch 409 in the off state and electrical current is not supplied from the battery power supply line 413. The memory package 403 can therefore be added without any adverse effects on the previously mounted memory packages 401 and 402.

The power feed system for the disk array unit will be described next in detail referring to FIG. 15 and based on the embodiment 1 shown in FIGS. 2 and 3. The two power feed systems and two bases of the first embodiment of this invention are shown in FIG. 15.

In this embodiment, the first bus 231 and the second bus 323 are connected by way of the backplane signal line layer 4A to all of the packages 1, 21, 22 and 23. The first bus 231 connects to the terminator packages 51 and 53. The second bus 232 connects to the terminator packages 52, 54.

The power supply 67 feeds the function packages 1, 21 and the terminator packages 51, 54 by means of the backplane power supply layer 3A.

The power supply 87 feeds the function packages 22, 23 and the terminator packages 52, 53 also by means of the backplane power supply layer 3A.

The terminator packages 51, 52, 53 and 54 draw more electrical current than the function packages so that the power feed line 204 for the function packages 1, 21, and the power feed lines 203, 208 for the terminator packages 51 and 54 are maintained separately.

The power feed line 214 for the function packages 22, 23, and the power feed lines 213, 218 for the terminator packages 52 and 53 are also maintained separately.

The function packages 1, 21, 22 and 23 here feed power to the function control circuits 12, 12B, 12C, and 12D by way of the reverse current suppressor circuits 11, 11B, 11C, 11D so that power fluctuations will be small during package insertion and removal.

Further, the terminator packages 51, 52, 53 and 54 because of their large current flow, feed power directly to the terminator circuits 5162, 5282, 5372 and 5452. This direct feed arrangement avoids the large voltage drop that occurs when current flows through the reverse current suppressor circuits.

Also, the power feed lines 208, 218 are first connected by way of the diodes 5161, 5281, 5371, 5451 prior to the feed lines 203, 213 during package insertion in order to prevent power fluctuations.

In this arrangement, for the terminator circuits 5162, 5282, 5372 and 5452, power is applied when the power feed lines 203, 213 are connected so that power fluctuations are small. Further, no power fluctuations will occur when the power feed lines 208, 218 are connected. Additionally power fluctuations in power feed lines 203, 213 induced by the inductors 222, 224 and the diodes 5161, 5281, 5371, 5451 are small.

The power supply sections 67, 87 feed power from power supplies 671, 871 to the power feed lines 203. 213 and the power feed lines 208, 218 by way of the diodes 673 and 873. The effect caused by power feed lines 208, 218 that feed packages drawing heavy current on the power feed lines 204, 214 Is suppressed by the diodes 672, 673, 872, and 873.

Incorporating the diodes 672, 673, 872 and 873 inside the power supply 67, 87 eliminates Inductance from wiring between the capacitors 1167 and 1187 Inside the power supply and the diodes while voltage fluctuations from the capacitor 1167, 1187 are reduced. The inductors 222 and 224 can be utilized as inductors such as for the power feed cables.

In the system of this embodiment, the paths 231 and 232 are operated Independently so that along with separate power feed systems for the terminator packages, power fluctuations from hot-line Insertion and removal are reduced thus providing the benefits that the large current capacity terminator packages can be replaced without shutting down the system.

In this invention, only a slight increase in power supplied from the battery power supply to the added memory package will occur by the Insertion of an additional memory package In a computer system having memory packages in battery backup status.

Therefore, excessive power consumption will not occur in the battery power supply and the battery life will not be expended after only a short time so that the battery can continue to maintain data stored In the memory package and memory packages can be added and replaced as needed.

Further, one among the plurality of memory packages in the computer system can be used as a redundancy measure to permit error correction with the beneficial effect that the replacement of previously mounted memory packages can be performed without loss of data.

Further, during maintenance of the memory package of this Invention, data from the memory package for maintenance can be temporarily stored in another memory package and the data then restored after the memory package has been replaced. This has the beneficial effect that that maintenance can be performed more quickly than if the data were temporarily stored in a magnetic disk type storage medium.

A still further advantage is that there is no adverse effect on packages having a small current capacity even if a package with a large current capacity is hot-line inserted or removed, thus preventing damage or malfunctions in the packages. An economical circuit structure is also attained because power feed of a plurality of power feed lines can be performed from one power supply.

We claim:

1. A computer, comprising:

a storage element mounted on a memory package, said memory package including a connector;

a power supply for supplying a first power supply line with electric power, wherein the first power supply line is connected by way of said connector to a first switch that leads electric power to said storage element; and a battery for supplying a second power supply line with electric power, the second power supply line being connected by way of said connector to a second switch that leads electric power to said storage element;

wherein said switches cooperates to function:

to maintain an off state during insertion or removal of said memory package when the power supply from said connector is off, to turn on state at a first time constant during insertion of said memory package when the power supply in on, to turn off at a second time constant during removal of said memory package when the power supply is on, and to maintain the on state, when the power supply switches from on to off with said memory package still inserted.

2. A memory package, comprising:

a connector that couples with a computer;

a storage element for storing information via said connector;

a first power supply line supplied with electric power via said connector by said computer, wherein the first power supply line is connected to a first switch that leads electric power to said storage element; and a second power supply line supplied with electric power via said connector by a battery, the second power supply line being connected to a second switch that leads electric power to said storage element;

wherein said switches cooperates to function:

to maintain an off state during insertion or removal of said memory package when said first power supply line is off, to turn on state at a first time constant during insertion of said memory package when said first power supply line is on, to turn off at a second time constant during removal of said memory package when said first power supply line is on, and to maintain the on state, when said first power supply line switches from on to off with said memory package still inserted.

3. A computer, comprising:

a storage element mounted on a memory package, said memory package including a connector;

a power supply for supplying a first power supply line with electric power, wherein the first power supply line is connected by way of said connector to a first switch that leads electric power to said storage element; and a battery mounted on said memory package, for supplying a second power supply line with electric power, the second power supply line being connected by way of said connector to a second switch that leads electric power to said storage element;

wherein said switches cooperates to function:

to maintain an off state during insertion or removal of said memory package when the power supply from said connector is off, to turn on state at a first time constant during insertion of said memory package when the power supply is on, to turn off at a second time constant during removal of said memory package when the power supply is on, and to maintain the on state, when the power supply switches from on to off with said memory package still inserted.

4. A memory package, comprising:

a connector that couples with a computer;

a storage element for storing information via said connector;

a first power supply line supplied with electric power via said connector by said computer, wherein the first power supply line is connected to a first switch that leads electric power to said storage element;

a second power supply line supplied with electric power by a battery, the second power supply line being connected to a second switch that leads electric power to said storage element; and said battery mounted on said memory package;

wherein said switches cooperates to function:

to maintain an off state during insertion or removal of said memory package when said first power supply line is off, to turn on state at a first time constant during insertion of said memory package when said first power supply line is on, to turn off at a second time constant during removal of said memory package when said first power supply line is on, and to maintain the on state, when said first power supply line switches from on to off with said memory package still inserted.

\* \* \* \* \*